United States Patent
Karda et al.

(10) Patent No.: US 9,219,225 B2
(45) Date of Patent: Dec. 22, 2015

(54) MULTI-BIT FERROELECTRIC MEMORY DEVICE AND METHODS OF FORMING THE SAME

(71) Applicant: Micron Technology, Inc., Boise, ID (US)

(72) Inventors: Kamal M Karda, Boise, ID (US); F Daniel Gealy, Kuna, ID (US); D. V. Nirmal Ramaswamy, Boise, ID (US); Chandra V Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 119 days.

(21) Appl. No.: 14/068,887

(22) Filed: Oct. 31, 2013

(65) Prior Publication Data

US 2015/0117084 A1 Apr. 30, 2015

(51) Int. Cl.
*G11C 11/22* (2006.01)
*H01L 43/02* (2006.01)
*H01L 43/12* (2006.01)
*G11C 11/56* (2006.01)
*H01L 27/115* (2006.01)
*H01L 49/02* (2006.01)

(52) U.S. Cl.
CPC .............. *H01L 43/02* (2013.01); *G11C 11/221* (2013.01); *G11C 11/2275* (2013.01); *G11C 11/5657* (2013.01); *H01L 27/11507* (2013.01); *H01L 28/40* (2013.01); *H01L 43/12* (2013.01)

(58) Field of Classification Search
CPC ................... H01L 27/11502; H01L 21/76843; H01L 21/76804; H01L 21/76831; H01L 21/76897; H01L 23/5226; G11C 11/22
USPC ................................ 365/145; 257/421; 438/3
See application file for complete search history.

(56) References Cited

U.S. PATENT DOCUMENTS 5,424,976 A 6/1995 Cuppens
5,808,929 A 9/1998 Sheikholeslami et al.
(Continued)

OTHER PUBLICATIONS

Ali Sheikholeslami et al., "A Survey of Circuit Innovations in Ferroelectric Random-Access Memories" Proceedings of the IEEE, vol. 88, Issue 5, Publication Issue: May 2000, 23 pages.
(Continued)

*Primary Examiner* — Fernando Hidalgo
(74) *Attorney, Agent, or Firm* — Brooks, Cameron & Huebsch, PLLC

(57) ABSTRACT

Multi-bit ferroelectric memory devices and methods of forming the same are provided. One example method of forming a multi-bit ferroelectric memory device can include forming a first ferroelectric material on a first side of a via, removing a material to expose a second side of the via, and forming second ferroelectric material on the second side of the via at a different thickness compared to the first side of the via.

30 Claims, 8 Drawing Sheets

(56) References Cited

U.S. PATENT DOCUMENTS

| | | | |
|---|---|---|---|
| 5,930,161 | A | 7/1999 | Sheikholeslami et al. |
| 6,150,184 | A * | 11/2000 | Evans et al. ............ 438/3 |
| 6,635,498 | B2 | 10/2003 | Summerfelt et al. |
| 6,683,803 | B2 | 1/2004 | Gudesen et al. |
| 7,254,051 | B2 | 8/2007 | Takashima |
| 7,764,529 | B2 | 7/2010 | Leistad et al. |
| 2004/0142498 | A1 | 7/2004 | Joo |
| 2004/0233744 | A1 | 11/2004 | Rodriguez et al. |
| 2006/0284224 | A1 | 12/2006 | Shuto |
| 2007/0051999 | A1 | 3/2007 | Shin et al. |
| 2010/0187583 | A1 * | 7/2010 | Wrazien et al. ........ 257/295 |
| 2012/0033478 | A1 * | 2/2012 | Kang ..................... 365/145 |

OTHER PUBLICATIONS

International Search Report and Written Opinion from related international application No. PCT/US2014/062820, dated Jan. 27, 2015, 12 pp.

* cited by examiner

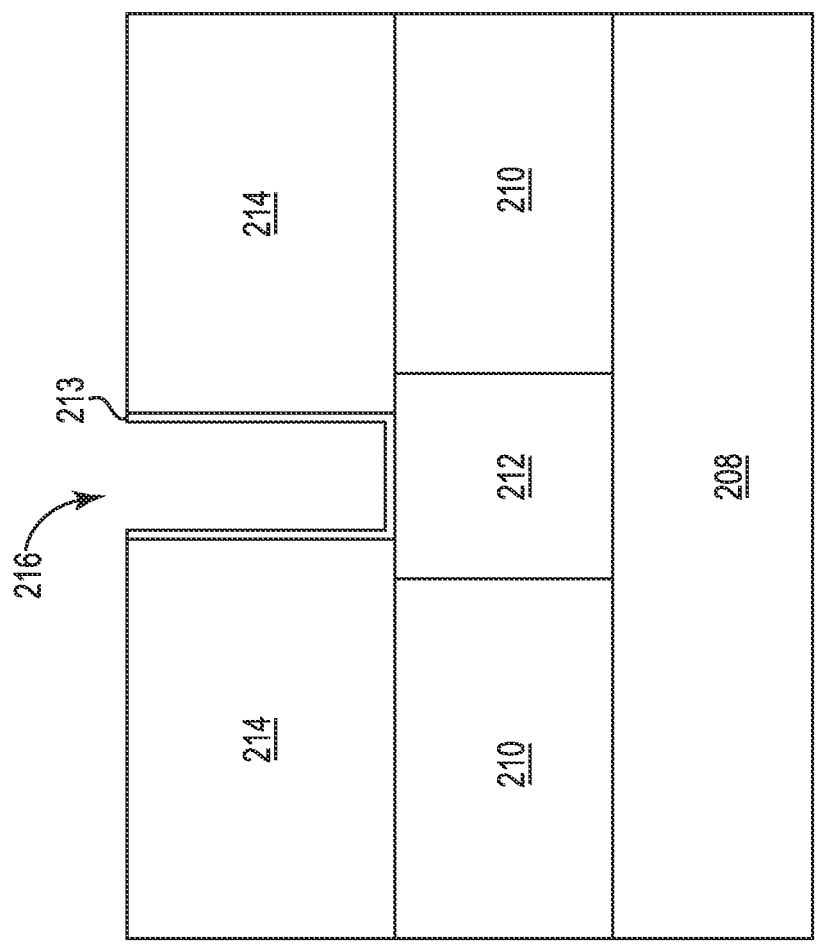

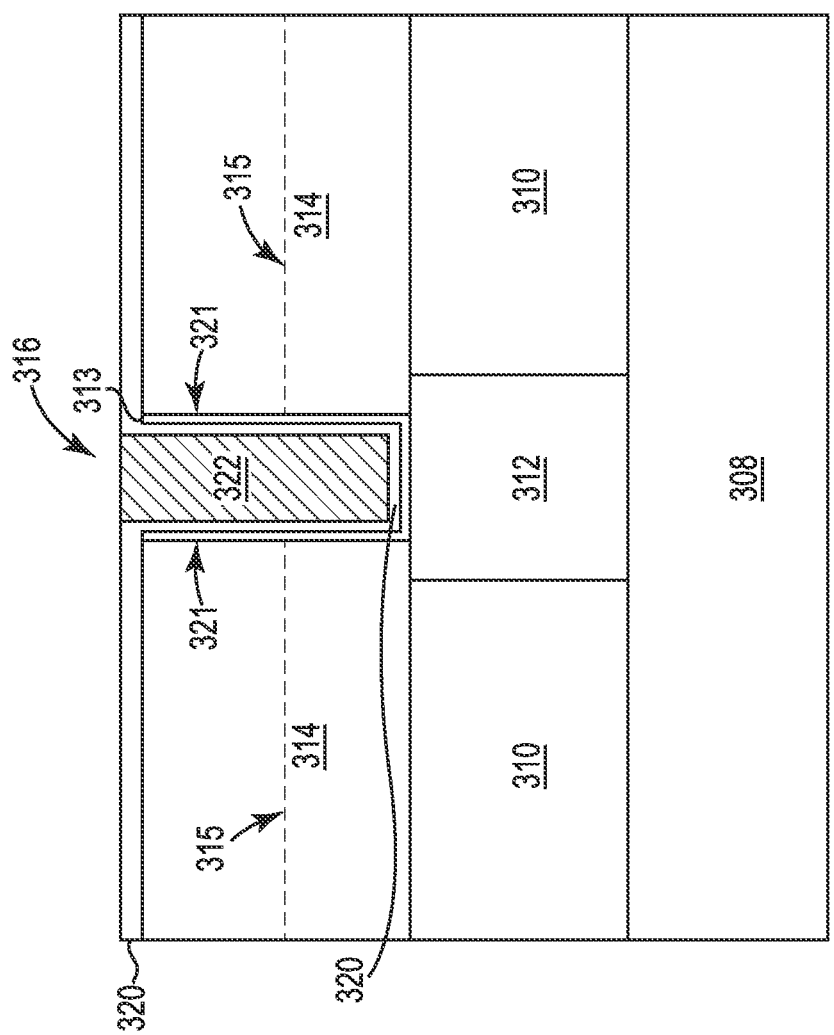

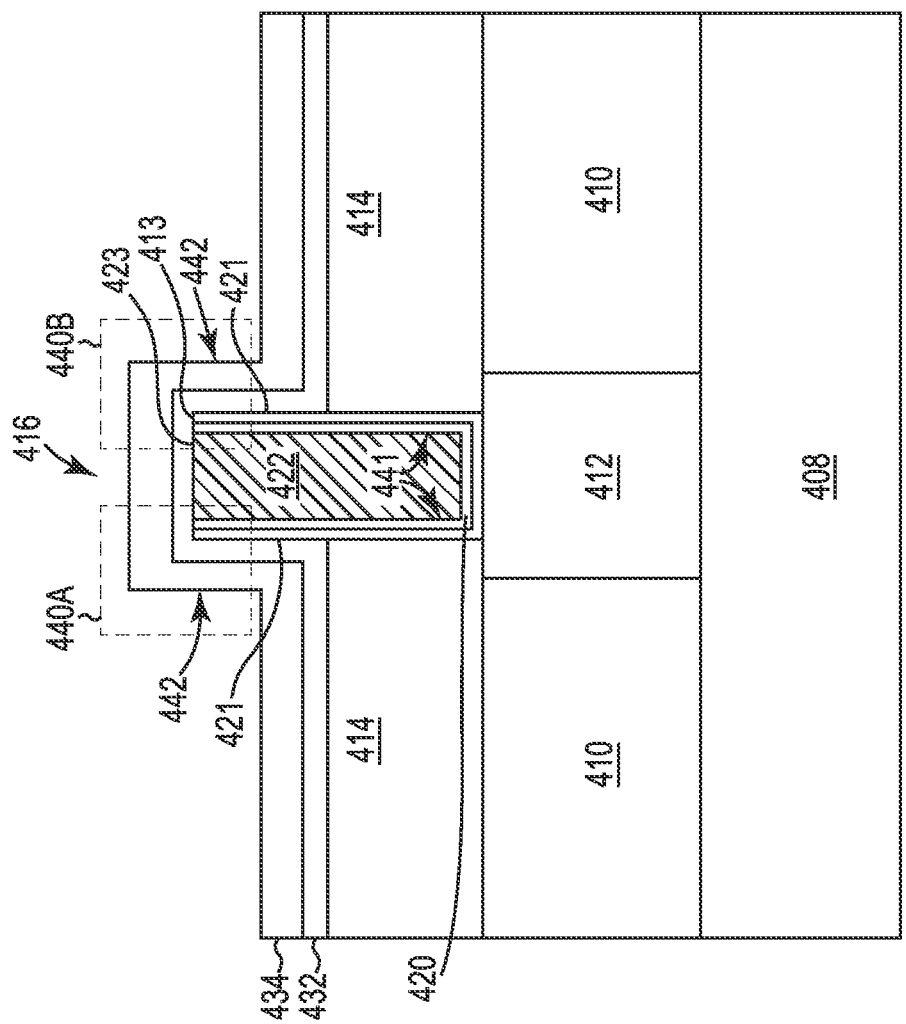

MULTI-BIT FERROELECTRIC MEMORY DEVICE AND METHODS OF FORMING THE SAME

TECHNICAL FIELD

The present disclosure relates generally to semiconductor devices and methods, and more particularly to multi-bit ferroelectric devices and methods of forming the same.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, and flash memory, among others. Types of resistive memory include phase change memory, programmable conductor memory, and resistive random access memory (RRAM), among others.

Some types of memory devices can be non-volatile memory and can be used for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Various resistive memory devices can include arrays of memory cells organized in a cross point architecture. In such architectures, the memory cells can include a cell stack comprising a storage element, e.g., a phase change element, in series with a select device, e.g., a switching element such as an ovonic threshold switch (OTS) or diode, between a pair of conductive lines, e.g., between an access line e.g., word line and a data/sense line e.g., bit line. The memory cells are located at the intersections of a word line and bit line and can be "selected" via application of appropriate voltages thereto.

BRIEF DESCRIPTION OF THE DRAWINGS

FIG. 2 illustrates a cross-sectional view of a portion of a multi-bit ferroelectric device formed in accordance with a number of embodiments of the present disclosure.

FIG. 3 illustrates a cross-sectional view of a portion of a multi-bit ferroelectric device formed in accordance with a number of embodiments of the present disclosure.

FIG. 4 illustrates a cross-sectional view of a portion of a multi-bit ferroelectric device formed in accordance with a number of embodiments of the present disclosure.

DETAILED DESCRIPTION

Figure 1A:
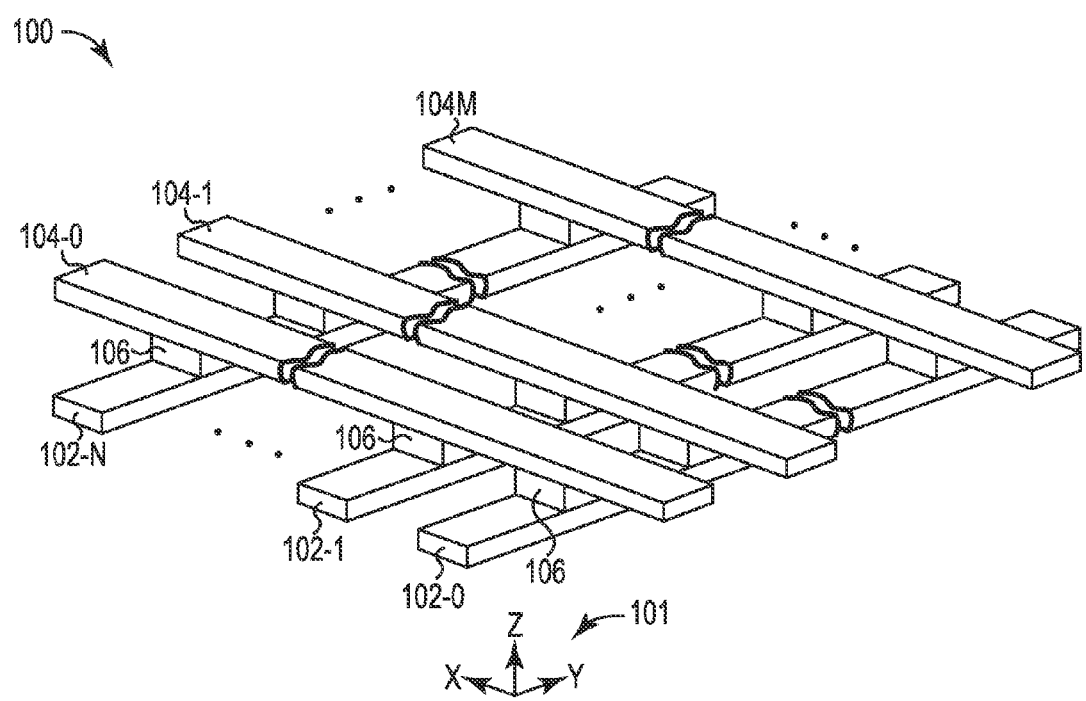
FIG. 1A illustrates a perspective view of a portion of a memory array in accordance with a number of embodiments of the present disclosure.

Multi-bit ferroelectric devices (e.g., multi-bit ferroelectric memory devices) and methods of forming the same are provided. One example method of forming a multi-bit ferroelectric memory device can include forming a first ferroelectric material on a first side of a via, removing a dielectric material to expose a second side of the via, and forming second ferroelectric material on the second side of the via at a different thickness compared to the first side of the via. The multi-bit ferroelectric memory device can include a number of polarization combinations that can be used to assign multiple states (e.g., state 00, state 01, state 10, state 11, etc.). The multi-bit ferroelectric memory device can be formed to include multiple sides with each side having a different coercive field (e.g., intensity of a bias that is needed to switch the polarization of the ferroelectric material). The different coercive fields can enable independent switching of the polarization of each side of the multi-bit ferroelectric memory device. Independent switching of the polarization of each side of the multi-bit ferroelectric memory device can include switching one side of the multi-bit ferroelectric memory device without switching a different side of the multi-bit ferroelectric memory device.

A number of writing and reading schemes can be implemented utilizing the multi-bit ferroelectric memory device as described herein. Biases can be applied to the multi-bit ferroelectric memory device to generate a number of polarization combinations between the multiple sides of ferroelectric material. That is, a state can be assigned to each of a number of polarization combinations and a bias can be applied to the multi-bit ferroelectric memory device to express each of the number of polarization combinations.

Embodiments of the present disclosure can provide benefits such as a memory device comprising ferroelectric material that can have a plurality of assigned states. Each of the assigned states can also store an applied charge that is equivalent to a single bit DRAM cell charge that can be released to a bit line within a memory array. In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 210 may reference element "10" in FIG. 2, and a similar element may be referenced as 310 in FIG. 3. Also, as used herein, "a number of" a particular element and/or feature can refer to one or more of such elements and/or features.

FIG. 1A illustrates a perspective view of a portion of a memory array 100 in accordance with a number of embodiments of the present disclosure. In this example, the array 100 is a cross-point array 100 including memory cells 106 at the intersections of a first number of conductive lines 102-0, 102-1, . . . , 102-N, e.g., access lines, which may be referred to herein as word lines, and a second number of conductive lines 104-0, 104-1, . . . , 104-M, e.g., data/sense lines, which may be referred to herein as bit lines. Coordinate axis 101 indicates that the bit lines 104-0, 104-1, . . . , 104-M are oriented in an x-direction and the word lines 102-0, 102-1, . . . , 102-N are oriented in a y-direction, in this example. As illustrated, the word lines 102-0, 102-1, . . . , 102-N are substantially parallel to each other and are substantially orthogonal to the bit lines 104-0, 104-1, . . . , 104-M, which are substantially parallel to each other; however, embodiments are not so limited. As used herein, the term "substantially" intends that the modified characteristic needs not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

The cross-point array 100 can be an array structure such as that described below in connection with FIGS. 2, 3, and 4, for instance. As an example, the memory cells 106 can be phase change random access memory (PCRAM) cells, resistive random access memory (RRAM) cells, conductive random access memory (CBRAM) cells, and/or spin transfer torque random access memory (STT-RAM) cells, among other types of memory cells. In various embodiments, the memory cells 106 can have a "stack" structure that includes a select device, e.g., a switching device, coupled in series to a storage element, e.g., a resistive storage element comprising a phase change material or metal oxide. As an example, the select device can be a diode, field effect transistor (FET), a bipolar junction transistor (BJT), or an ovonic threshold switch (OTS), among other switching elements.

In a number of embodiments, the select device and storage element associated with the respective memory cells 106 can be series coupled two-terminal devices. For instance, the select device can be a two-terminal OTS, e.g., a chalcogenide alloy formed between a pair of electrodes, and the storage element can be a two-terminal phase change storage element, e.g., a phase change material (PCM) formed between a pair of electrodes. In a number of embodiments, an electrode can be shared between the select device and storage element of the memory cells 106. Also, in a number of embodiments, the bit lines 104-0, 104-1, . . . , 104-M and the word lines 102-0, 102-1, . . . , 102-N can serve as top or bottom electrodes corresponding to the memory cells 106.

In operation, the memory cells 106 of array 100 can be programmed by applying a voltage, e.g., a write voltage, across the memory cells 106 via selected conductive lines, e.g., word lines 102-0, 102-1, . . . , 102-N and bit lines 104-0, 104-1, . . . , 104-M. The width and/or magnitude of the voltage pulses across the memory cells 106 can be adjusted, e.g., varied, in order to program the memory cells 106 to particular logic states, e.g., by adjusting a resistance level of the storage element.

A sensing, e.g., read, operation can be used to determine the logic state of a memory cell 106. For instance, particular voltages can be applied to a bit line 104-0, 104-1, . . . , 104-M and word line 102-0, 102-1, . . . , 102-N corresponding to a selected memory cell 106, and current through the cell responsive to a resulting voltage difference can be sensed. Sensing operations can also include biasing unselected word lines and bit lines, e.g., word lines and bit lines coupled to non-selected cells, at particular voltages in order to sense the logic state of a selected cell 106.

As an example, the array 100 can be operated in accordance with a half select method, e.g., a half select biasing scheme. A half select method can include applying a half select voltage (V/2) to a selected bit line, e.g., a bit line coupled to a selected memory cell, and a negative half select voltage (−V/2) to a selected word line, e.g., a word line coupled to the selected memory cell, while biasing unselected word lines and bit lines at a reference potential, e.g., a ground potential. As such, a full select voltage (V) is applied across the selected memory cell. In this example, the unselected memory cells coupled to the selected bit line and/or selected word line experience a half select voltage of +/−V/2 and can be referred to as "half selected" cells. The select devices can allow current through selected memory cells, e.g., cells experiencing the full select voltage (V), while blocking or limiting current through unselected cells coupled to a selected word line and/or bit line, e.g., cells experiencing the half select voltage. In this example, unselected memory cells coupled to unselected bit lines and/or word lines are unbiased, e.g., they experience a ground potential of 0V, in this example. The select voltage (V) can be a write voltage or a read voltage, for instance. Embodiments of the present disclosure are not limited to a half select method associated with programming or reading cells of array 100. For instance, the array 100 can be operated in accordance with other biasing schemes, such as a one third select method, among other biasing schemes.

Figure 1B:
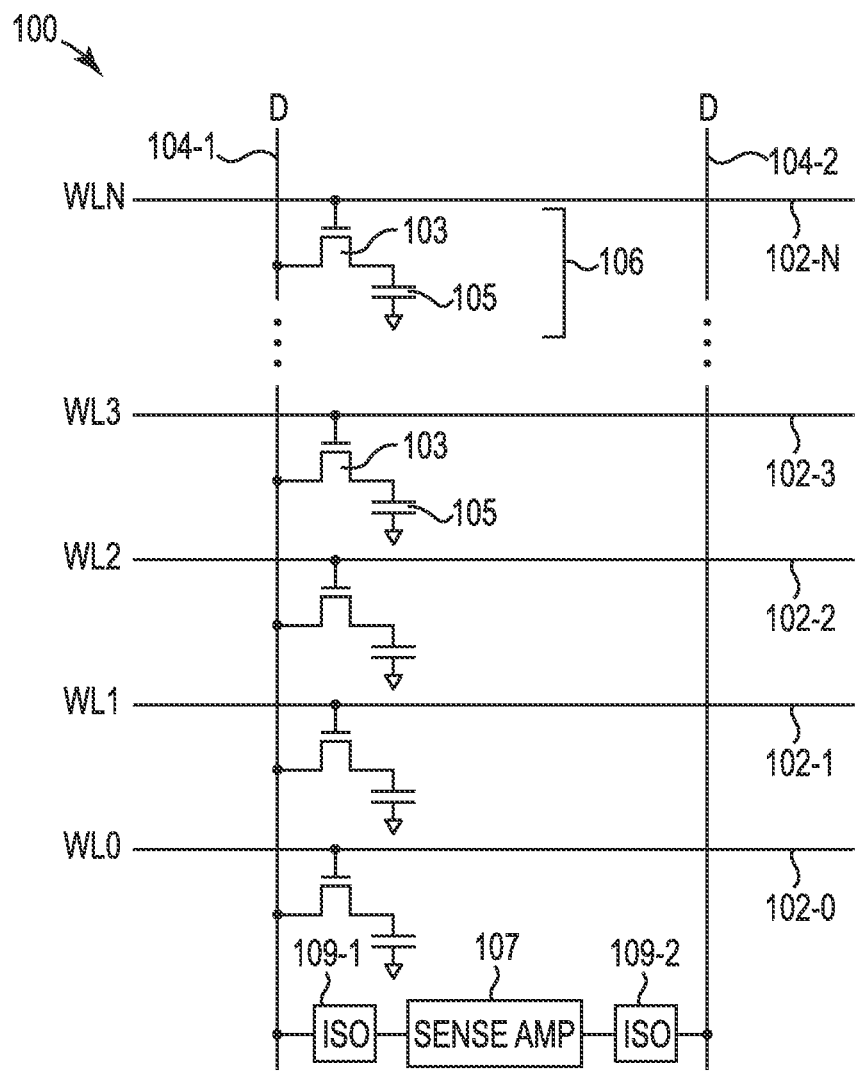
FIG. 1B illustrates a schematic diagram of a portion of a memory array in accordance with a number of embodiments of the present disclosure.

FIG. 1B illustrates a schematic diagram of a portion of a memory array 100 in accordance with a number of embodiments of the present disclosure. In this example, the memory array 100 is a DRAM array of 1T1C (one transistor one capacitor) memory cells each comprised of an access device 103 (e.g., transistor) and a storage element 105 (e.g., a capacitor) within area 106. The cells of array 100 are arranged in rows coupled by word lines 102-0 (WL0), 102-1 (WL1), 102-2, (WL2) 102-3 (WL3), 102-N (WLN) and columns coupled by sense lines (e.g., digit lines) 104-1 (D) and 104-2 (D_). In this example, each column of cells is associated with a pair of complementary sense lines 104-1 (D) and 104-2 (D_).

Although only a single column of memory cells is illustrated in FIG. 1B, embodiments are not so limited. For instance, a particular array may have a number of columns of memory cells and/or sense lines (e.g., 4,096, 8,192, 16,384, etc.). A gate of a particular memory cell transistor 103 is coupled to its corresponding word line 102-0, 102-1, 102-2, 102-3, . . . , 102-N, a first source/drain region is coupled to its corresponding sense line 104-1, and a second source/drain region of a particular memory cell transistor is coupled to its corresponding capacitor 105. Although not illustrated in FIG. 4, the sense line 104-2 may also be coupled to a number of memory cells. In some embodiments of the present disclosure, the capacitor 105 is a multi-bit ferroelectric device that is produced utilizing the process described herein.

The array 100 is coupled to sensing circuitry in accordance with a number of embodiments of the present disclosure. In this example, the sensing circuitry comprises a sense amplifier 107 and an accumulator.

The example shown in FIG. 1B includes isolation circuitry 471-1 located between the sense amplifier 107 and the memory cells coupled to digit line 104-1 and isolation circuitry 109-2 located between sense amplifier 107 and memory cells (not shown) coupled to complementary sense line 104-2. The isolation circuitry 109-1 and/or 109-2 can comprise a number of isolation devices, such as a number of transistors.

FIG. 2 illustrates a cross-sectional view of a portion of a multi-bit ferroelectric device formed in accordance with embodiments of the present disclosure. The multi-bit ferroelectric device cell structure shown in FIG. 2 includes a base semiconductor structure that includes a substrate 208 including a conductive contact 212 formed in a first dielectric material 210. The substrate 208 can be a silicon substrate, silicon on insulator (SOI) substrate, or silicon on sapphire (SOS) substrate, among others. The first dielectric material 210 can be a nitride or oxide such as silicon dioxide ($SiO_2$), among other dielectric materials. The conductive contact 212 can be made of tungsten (W) or other suitable conductive material and can be formed in the first dielectric material 210 via a masking and etching process, for instance. The conductive contact 212 can be made of various conductive materials or composite structures including TiN (titanium nitride), TaN (tantalum nitride), copper, iridium, platinum, ruthenium, and/or tungsten, for example.

The structure includes a via 216 formed over the conductive contact 212. In this example, the via 216 is formed through a second dielectric material 214 (e.g., silicon dioxide) to expose the top surface of the conductive contact 212 and can be referred to as a contact hole or contact via 216. The second dielectric material 214 can be the same type of dielectric material or a different type of dielectric material as the first dielectric material 210. In one or more embodiments, the via 216 has a diameter of not greater than 20 nanometers (nm). However, embodiments are not limited to a particular diameter of via 216, which can be formed by masking and etching, among other suitable processes. A number of etchants can be utilized to remove the second dielectric material including, but not limited to: ethylenediamine pyrocatechol (EDP), potassium hydroxide/isopropyl alcohol (KOH/IPA), or tetramethylammonium hydroxide (TMAH). Although not shown in FIG. 2, the conductive contact 212 can be coupled to an access device (e.g., an access transistor) corresponding to a particular memory cell (e.g., a resistance variable memory cell such as a PCRAM cell or RRAM cell, multi-bit ferroelectric memory device as described herein).

A conductive material or composite structure 213 can be deposited in the via 216. The conductive material or composite structure 213 can be made of various conductive materials or composite structures including TiN (titanium nitride), TaN (tantalum nitride), copper, iridium, platinum, ruthenium, and/or tungsten, for example. The conductive material or composite structure 213 can be evenly deposited on the interior of the via 216. As described herein, the conductive material or composite structure 213 can protect a deposited ferroelectric material from an etching step to remove a portion of the dielectric material 214.

FIG. 3 illustrates a cross-sectional view of a portion of a multi-bit ferroelectric device formed in accordance with embodiments of the present disclosure. FIG. 3 includes a number of the same elements as described in reference to FIG. 2. For example, FIG. 3 includes a substrate 308 including a conductive contact 312 formed in a first dielectric material 310. In addition, FIG. 3 includes a via 316 formed through a second dielectric material 314.

A first ferroelectric material 320 can be deposited on the second dielectric material 314 and in the via 316. The first ferroelectric material 320 can include a doped Hafnium Oxide ($HfO_2$), a perovskite material such as calcium titanium oxide ($CaTiO_3$), and/or a number of other thin film materials that have ferroelectric properties. The ferroelectric properties of the first ferroelectric material 320 can include, but are not limited to, a material that includes a spontaneous electric polarization (e.g., inherent electric polarization). The electric polarization of the first ferroelectric material 320 can be in a first direction and the electric polarization of the first ferroelectric material 320 can be changed to a second direction upon an application of a bias. The bias includes establishing predetermined voltages and/or currents at various points for establishing particular operating conditions. That is, the bias is an application of a particular voltage and/or current to change the direction of the electric polarization to a desired direction. The ferroelectric material can be deposited at a first thickness of approximately 2-10 nanometers.

After depositing the first ferroelectric material 320, a poly material 322 can be deposited in the via 316. The poly material 322 can include a number of materials. For example, the poly material 322 can include poly methyl methacrylate (PMMA). In another example, the poly material 322 can include a dielectric material that is the same as or similar to the first dielectric material 310 and/or the second dielectric material 314. The poly material is deposited to protect the deposited first ferroelectric material 320 within the via 316 from an etching process to remove a portion of the second dielectric material 314. That is, the poly material 322 can include a material that will protect the first ferroelectric material 320 within via 316 from an etching process to remove a portion of the second dielectric material 314 below an upper surface of the poly material 322. The conductive material or composite structure 313 deposited within the via 316, as described in reference to FIG. 2 (e.g., conductive material or composite structure 213), can protect the first ferroelectric material 320 from the etching process to remove the portion of the second dielectric material 314.

The dashed line within second dielectric material 314 can represent a stopping point 315 for the second dielectric material 314 to be removed utilizing an etching process. That is, the top portion of the second dielectric material 314 is removed to expose a second side 321 of the via 316 for depositing a second ferroelectric material. The etching process removes the portion of second dielectric material 314 without removing the first ferroelectric material 320 within the via 316 or the poly material 322 within the via 316. For example, the top portion (e.g., portion above the stopping point 315) of second dielectric material 314 can be removed utilizing a selective isotopic etch process that prefers removing the second dielectric material 314 over the poly material 322 and/or the first ferroelectric material 320. In this example, the selective isotopic etch process can be stopped at the stopping point 315 to expose the second side 321 of the via 316.

FIG. 4 illustrates a cross-sectional view of a portion of a multi-bit ferroelectric device formed in accordance with embodiments of the present disclosure. FIG. 4 includes a number of elements as described in reference to FIG. 2 and FIG. 3. For example, FIG. 4 includes a substrate 408 including a conductive contact 412 formed in a first dielectric material 410. In addition, FIG. 4 includes a via 416 formed through a second dielectric material 414. The second dielectric material 414 represents the remaining portion of second dielectric material 314 subsequent to the etching process described in connection with FIG. 3. In addition, FIG. 4 includes a conductive material or composite structure 413.

A third dielectric material 432 can optionally be deposited on the second dielectric material 414 and on the exterior portion (e.g., side 421, side 321 referenced in FIG. 3) of via 416. The third dielectric material 432 is deposited over the poly material 422. The third dielectric material 432 separates the first ferroelectric material 420 and a second ferroelectric material 434. In this manner, a multi-bit ferroelectric device as provided, which has a first ferroelectric material 420 and a second ferroelectric material 434 separated by the third dielectric material 432. That is, the first ferroelectric material 420 separated from the second ferroelectric material 432 by the third dielectric material 432 acts as an electric dipole.

The second ferroelectric material 434 can be the same and/or different ferroelectric material as the first ferroelectric material 420. Similarly, the first dielectric material 410, the second dielectric material 414, and/or the third dielectric material 432 can be the same and/or different dielectric materials. The second ferroelectric material 434 can be deposited at a different thickness than the first ferroelectric material 420. For example, in at least one embodiment, the second ferroelectric material 434 can be thicker than the first ferroelectric material 420. In at least one embodiment the thickness of the second ferroelectric material 434 can range between 2-10 nanometers. In a particular embodiment, the thickness of first ferroelectric material can be 3 nanometers and the thickness of the second ferroelectric material can be 6 nanometers.

The first ferroelectric material 420 and the second ferroelectric material 434 can have different coercive fields. That is, the first ferroelectric material 420 can have a first coercive field and the second ferroelectric material 434 can have a second coercive field. As such, the intensity of the bias (e.g., intensity of the voltage, intensity of the current, etc.) that is needed to switch the polarization of the first ferroelectric material 420 is different than the intensity of the bias needed to switch the polarization of the second ferroelectric material 434. The different coercive fields for the first ferroelectric material 420 and the second ferroelectric material 434 can be accomplished by depositing the second ferroelectric material at a greater thickness compared to the first ferroelectric material 420. In addition, the different coercive fields for the first ferroelectric material 420 and the second ferroelectric material 434 can be accomplished by depositing a first ferroelectric material 420 that is a different type of ferroelectric material than the second ferroelectric material 434. When different ferroelectric materials are utilized for the first ferroelectric material 420 and the second ferroelectric material 434, the thickness of the first ferroelectric material 420 and the second ferroelectric material 434 can be similar and/or the same thickness. That is, the difference in the coercive field between the first ferroelectric material 420 and the second ferroelectric material 434 can be accomplished by utilizing different ferroelectric materials with different intrinsic coercive fields (e.g., natural coercive field).

FIG. 4 illustrates two sides (e.g., interior side 441, exterior side 442) of the via 416 with deposited ferroelectric material. The interior side 441 can be on the interior side of the via 416. The interior side 441 can comprise the first ferroelectric material 420. The exterior side 442 can be on the exterior side of the via 416. The exterior side 442 can include the third dielectric material 432 and the second ferroelectric material 434. After depositing the ferroelectric material 434, the poly material 422 is removed from the via 416. The poly material is removed through an etching process to expose the via 416. As a result, the via 416 now separates a first multi-bit ferroelectric device 440A and a second multi-bit ferroelectric device 440B.

Figure 5:
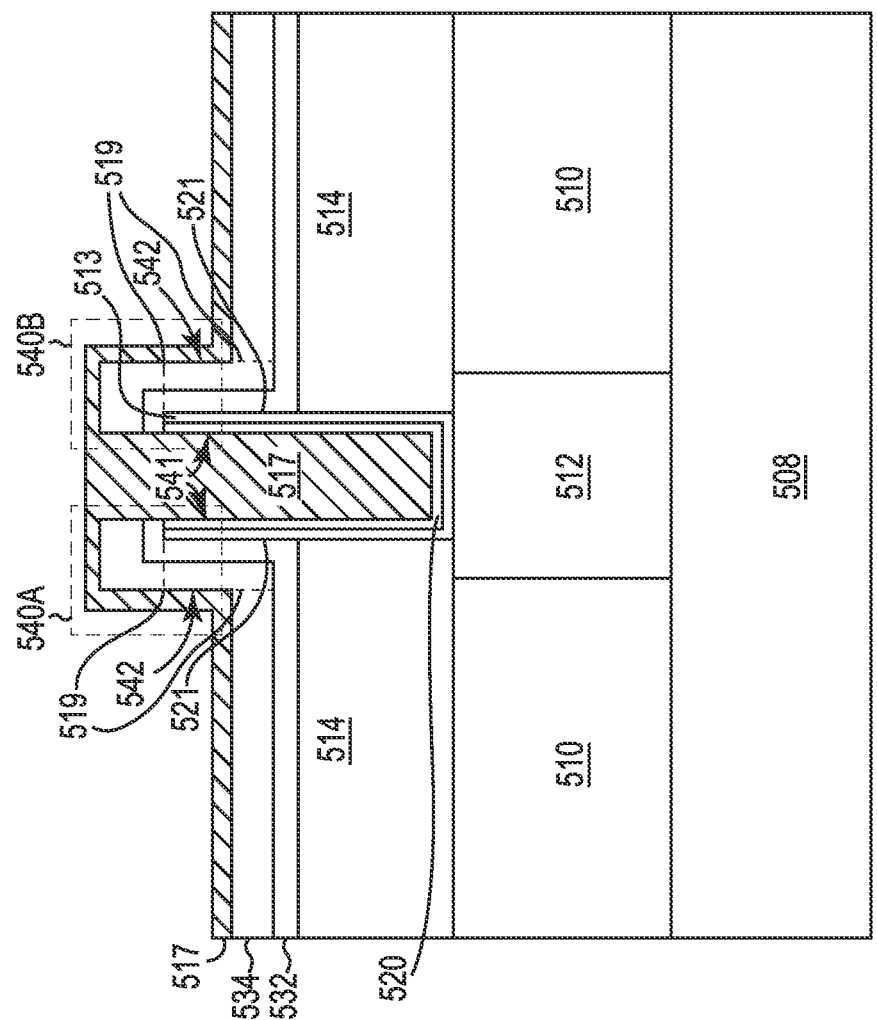
FIG. 5 illustrates a cross-sectional view of a portion of a multi-bit ferroelectric device formed in accordance with a number of embodiments of the present disclosure.

FIG. 5 illustrates a cross-sectional view of a portion of a multi-bit ferroelectric device formed in accordance with embodiments of the present disclosure. FIG. 5 includes a number of elements as described in reference to FIG. 2, FIG. 3, and FIG. 4. For example, FIG. 5 includes a substrate 508 including a conductive contact 512 formed in a first dielectric material 510. In addition, FIG. 5 includes a via 516 formed through a second dielectric material 514. In addition, FIG. 5 includes a conductive material or composite structure 513.

In some embodiments, an etching process (e.g., anisotropic etch, spacer etch, etc.) can be utilized to remove a portion of the second ferroelectric material 534 and the second dielectric material 532. For example, an anisotropic etching process is utilized to remove a portion of the second ferroelectric material 534 and the second dielectric material 532. In this example, the anisotropic etching process can remove the second ferroelectric material 534 and the second dielectric material 532 that exists above the via and/or the second ferroelectric material 534 and the second dielectric material 532 deposited on the first dielectric material 514. That is, the etching process can be a vertical etching process that removes the second ferroelectric material 534 and the second dielectric material 532 that is not within dashed lines 519.

A conductive material 517 is deposited on the second ferroelectric material 534. The conductive contact 517 can be made of various conductive materials or composite structures including TiN (titanium nitride), TaN (tantalum nitride), copper, iridium, platinum, ruthenium, and/or tungsten, for example. The conductive material 517 acts as a second plate for the multi-bit ferroelectric devices. The conductive material 517 can be continuous and can be deposited across a plurality of cells and/or can be deposited across an entire memory array.

A first multi-bit ferroelectric device 540A and a second ferroelectric device 540B are formed after removal of the poly material (e.g., poly material 442 as referenced in FIG. 4) from the via 516. The multi-bit ferroelectric device 540A represents a first multi-bit ferroelectric device where the ferroelectric material on one side (e.g., the left side 542) is thicker than a thickness of the ferroelectric material on another side (e.g., the right side 541). The second multi-bit ferroelectric device 540B represents a multi-bit ferroelectric device where the ferroelectric material on one side (e.g., the left side 541) is thinner than a thickness of the ferroelectric material on another side (e.g., the right side 542).

Figure 6B:
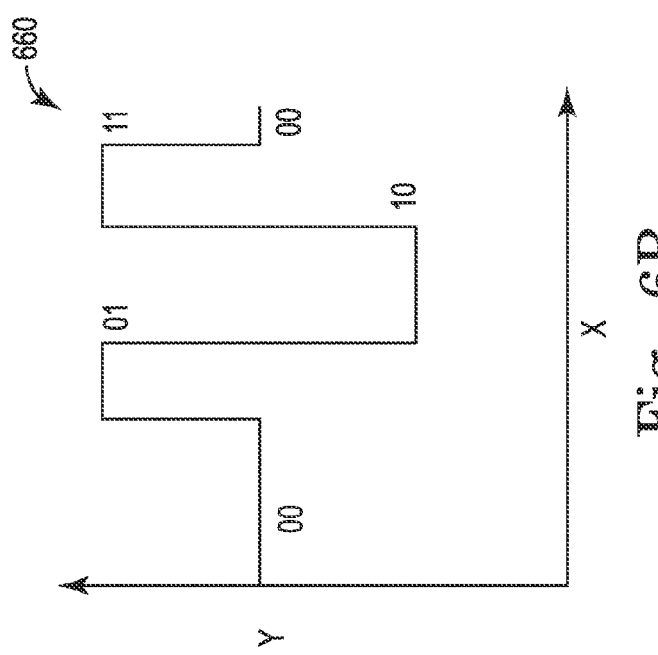
FIGS. 6A and 6B illustrate an example of a write scheme utilizing a multi-bit ferroelectric device formed in accordance with a number of embodiments of the present disclosure.
Figure 6A:
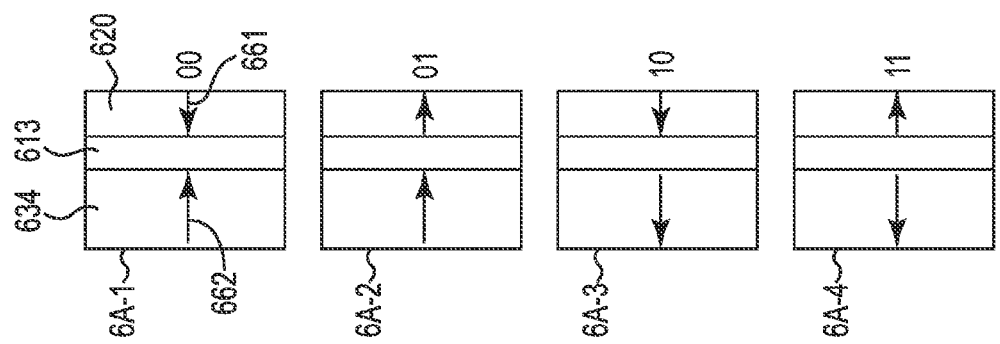

FIGS. 6A and 6B illustrate an example of a write scheme utilizing a multi-bit ferroelectric device (e.g., multi-bit ferroelectric device 540A, multi-bit ferroelectric device 540B as referenced in FIG. 5) formed in accordance with a number of embodiments of the present disclosure. As described herein, the multi-bit ferroelectric device has a first side with ferroelectric material that has a first coercive field and a second side with ferroelectric material that has a second coercive field. In addition, or alternatively, the multi-bit ferroelectric device can have a first side with ferroelectric material of a first thickness and a second side with ferroelectric material of a second thickness. Also, the first side and the second side can be separated by a dielectric material acting as an electric dipole.

FIGS. 6A-1, 6A-2, 6A-3, and 6A-4 illustrate four assigned states to the multi-bit ferroelectric device (e.g., multi-bit ferroelectric device 540A, multi-bit ferroelectric device 540B as referenced in FIG. 5). As described herein, the multi-bit ferroelectric device has a first side of ferroelectric material 620 (right side of the ferroelectric devices) and a second side of ferroelectric material 634 (left side of the ferroelectric devices) that are separated by a conductive material 613 to form an electric dipole. As described herein, the first side of the multi-bit ferroelectric device and the second side of the multi-bit ferroelectric device have a different coercive field. As illustrated in FIGS. 6A-1, 6A-2, 6A-3, and 6A-4, the first side of ferroelectric material 620 and the second side of ferroelectric material 634 have different coercive fields by having different thicknesses. For example, the left side of ferroelectric material 634 has a greater thickness of ferroelectric material compared to the right side of ferroelectric material 620.

The write scheme includes assigning a state (e.g., binary state, numerical value, etc.) to a number of polarization combinations of the multi-bit ferroelectric device. The number of polarization combinations include a first and a second polarization direction for each side of the multi-bit ferroelectric device. For example, a state of 00 is assigned to the multi-bit ferroelectric device 6A-1. That is, the state of 00 is assigned when the polarization direction (represented by arrow 662) of the ferroelectric material on the left side 634 is directed towards the conductive material 613 and the polarization direction (represented by arrow 661) of the ferroelectric material on the right side 620 is also directed towards the conductive material 613.

The write scheme can use an initial state (e.g., state that is in a particular polarization combination at a particular bias, state 00) and assign a state to the remaining polarization combinations based on a bias applied to achieve the remaining polarization combinations. FIG. 6A-1 illustrates the initial state and assigned the initial state as 00. The initial state 00 in FIG. 6A-1 is changed to state 01 in FIG. 6A-2 by applying a relatively small bias in a first direction. The relatively small bias is a bias that includes a voltage and/or current that changes the polarization direction of the first side (thinner side, right side, ferroelectric material 620 as referenced in FIG. 6A-1) and does not change the polarization direction of the second side (thicker side, left side, ferroelectric material 634 as referenced in FIG. 6A-1). That is, the relatively small bias can alter the polarization direction the first side but does not have the voltage and/or current to the change the polarization direction of the second side. The state 01 in FIG. 6A-2 includes the polarization direction of the left side directed towards the dielectric material and the right side directed away from the dielectric material.

The state 01 in FIG. 6A-2 is changed to state 10 in FIG. 6A-3 by applying a bias that includes a relatively large voltage and/or current in a second direction. The relatively large bias is a bias that changes the polarization direction of the first side of ferroelectric material and the polarization direction of the second side of ferroelectric material. The second direction can be an opposite direction from the first direction applied to change the state from 00 to 01. The state 10 in FIG. 6A-3 includes the polarization direction of the left side directed away from the dielectric material and the polarization direction of the right side is directed towards the dielectric material.

The state 10 in FIG. 6A-3 is changed to state 11 in FIG. 6A-4 by applying a bias that includes a relatively small voltage and/or current in the second direction. The bias applied to the state 10 changes the polarization direction of the right side of ferroelectric material without changing the polarization direction of the left side of ferroelectric material. The state 11 in FIG. 6A-4 includes the polarization direction of the left side of ferroelectric material directed away from the dielectric material and the polarization direction of the right side of ferroelectric material is directed away from the dielectric material. Each state (e.g., state 00, state 01, state 10, state 11) can store a charge equivalent to a single bit DRAM cell charge.

FIG. 6B illustrates a graph 660 that illustrates a Y-axis that represents a voltage and an X-axis that represents time to further display how a bias is applied to achieve each of the states (e.g., state 00, state 01, state 10, state 11, etc.). The state 00 represents an initial state at a particular voltage at a first time. At a second time the voltage can be applied in a first direction to produce state 01. At a third time a voltage can be applied in a second direction that is opposite to the first direction to produce state 10. At a fourth time a voltage can be applied in the first direction to produce state 11. At a fifth time a voltage can be applied in the second direction to return to the initial state 00.

Figure 7B:
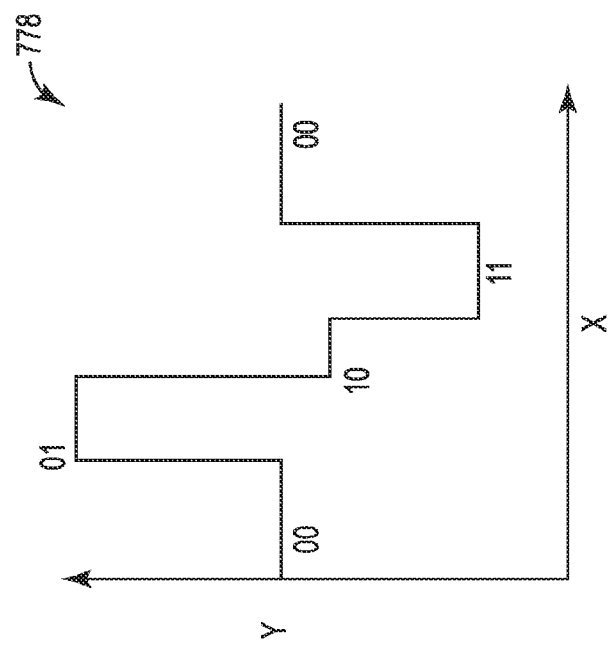
FIGS. 7A and 7B illustrate an example of a write scheme utilizing a multi-bit ferroelectric device formed in accordance with a number of embodiments of the present disclosure.
Figure 7A:
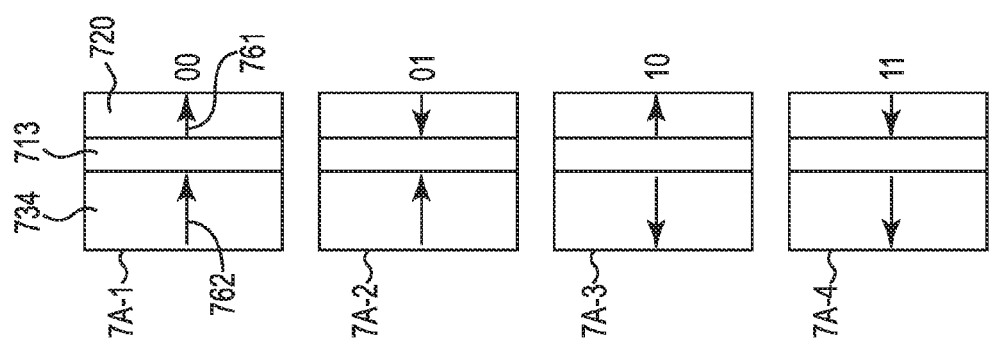

FIGS. 7A and 7B illustrate an example of a write scheme utilizing a multi-bit ferroelectric device (e.g., multi-bit ferroelectric device 540A, multi-bit ferroelectric device 540B as referenced in FIG. 5) formed in accordance with a number of embodiments of the present disclosure. As described herein, the multi-bit ferroelectric device can have a first side with ferroelectric material that has a first coercive field and a second side with ferroelectric material that has a second coercive field. In addition, or alternatively, the multi-bit ferroelectric device can have a first side with ferroelectric material of a first thickness and a second side with ferroelectric material of a second thickness. Also, the first side and the second side can be separated by a dielectric material acting as an electric dipole.

FIGS. 7A-1, 7A-2, 7A-3, and 7A-4 illustrate four assigned states to the multi-bit ferroelectric device. As described herein, the multi-bit ferroelectric device can have a first side of ferroelectric material 720 (right side of the ferroelectric device) and a second side of ferroelectric material 734 (left side of the ferroelectric device) that are separated by a conductive material 713 forming an electric dipole. As described herein, the first side of the multi-bit ferroelectric device and the second side of the multi-bit ferroelectric device can have a different coercive field. As illustrated in FIG. 6A-1, the first side of ferroelectric material 720 and the second side of ferroelectric material 734 have different coercive fields by having different thicknesses. For example, the left side of ferroelectric material 734 has a greater thickness of ferroelectric material compared to the right side of ferroelectric material 720.

The write scheme includes assigning a state (e.g., binary state, numerical value, etc.) to a number of polarization combinations of the multi-bit ferroelectric device. The number of polarization combinations include a polarization direction (e.g., represented by arrow 761) of a first side of ferroelectric material and a polarization direction (e.g., represented by arrow 762) of a second side of ferroelectric material 734. For example, a state of 00 is assigned to the polarization combination of FIG. 7A-1. In this example, the state of 00 is assigned when the polarization direction 762 of the ferroelectric material 734 on the left side is directed towards the conductive material 713 and the polarization direction 761 of the ferroelectric material 720 on the right side is directed away from the conductive material 713.

The initial state 00 in FIG. 7A-1 is changed to state 01 in FIG. 7A-2 by applying a relatively small bias in a first direction. The relatively small bias is a bias that includes a voltage and/or current that changes the polarization direction of the first side of ferroelectric material 720 (thinner side, right side) and does not change the polarization direction of the second side of ferroelectric material 734 (thicker side, left side). The state 01 in FIG. 7A-2 includes the polarization direction of the left side of ferroelectric material directed towards the dielectric material and the polarization direction of the right side of ferroelectric material is directed away from the dielectric material.

The state 01 in FIG. 7A-2 is changed to state 10 in FIG. 7A-3 by applying a bias that includes a relatively large voltage and/or current in a second direction. The relatively large bias is a bias that changes the polarization direction of the first side of ferroelectric material and the polarization direction of the second side of ferroelectric material. The second bias direction can be an opposite direction from the first bias direction applied to change the state from 00 to 01. The state 10 can include the left side and the right side having a polarization direction that is away from the dielectric material.

The state 10 in FIG. 7A-3 is changed to state 11 in FIG. 7A-4 by applying a bias that includes a relatively small voltage and/or current in the second direction. The bias applied to the state 10 changes the polarization direction of the right side of ferroelectric material without changing the polarization direction of the left side of ferroelectric material. The state 11 can include a polarization direction of the left side of ferroelectric material being away from the dielectric material and a polarization direction of the right side of ferroelectric material towards the dielectric material. Each state (e.g., state 00, state 01, state 10, state 11) can store a charge equivalent to a single bit DRAM cell charge.

FIG. 7B can include a graph 778 illustrates a Y-axis that represents a voltage and an X-axis that represents time in order to further display how a bias is applied to achieve each of the states (e.g., state 00, state 01, state 10, state 11, etc.). The state 00 represents an initial state at a particular voltage at a first time. At a second time the voltage can be applied in a first direction to produce state 01. At a third time a voltage can be applied in a second direction to produce state 10, wherein the second direction is opposite to the first direction. At a fourth time a voltage can be applied in the second direction to produce state 11. At a fifth time a voltage can be applied in the first direction to return the multi-bit ferroelectric device to the initial state 00.

The write scheme described herein and referenced within FIGS. 6A, 6B and FIGS. 7A, 7B can include reassigning a number of the states (e.g., state 00, state 01, state 10, state 11, etc.) to correspond to a bias that is different from the previous corresponding bias for the state. Reassigning each of the states to correspond to a different bias and/or correspond to a particular polarization combination between a first side of ferroelectric material and a second ferroelectric material can enable the multi-bit ferroelectric device to be switched from a first state to any second state. For example, the state 01 in FIG. 7A-2 can be reassigned to state 11. In this example, a bias can be applied to the state 00 in FIG. 7A-1 to change the state 00 to state 11 without having to apply intermediate biases. In this example, as described herein, the state 00 in FIG. 7A-1 is changed to state 11 in FIG. 7A-2 by applying a relatively small bias in a first direction. The relatively small bias is a bias that includes a voltage and/or current that changes the polarization direction of the first side of ferroelectric material 720 (thinner side, right side) and does not change the polarization direction of the second side of ferroelectric material 734 (thicker side, left side).

A read scheme can be implemented for each of the write schemes described herein and referenced within FIGS. 6A, 6B and FIGS. 7A, 7B. The read scheme can be similar to a destructive read scheme for ferroelectric devices. The read scheme utilizes the bias that is applied to the multi-bit ferroelectric device, as described herein. The net polarization from the bias applied to the multi-bit ferroelectric device can be transferred to a bit line within a memory array (e.g., memory array 100, etc.). The bit line will have states that correspond to the assigned states for each polarization combination within the multi-bit ferroelectric device. That is, there will be four states within the bit line that correspond to the four states (e.g., state 00, state 01, state 10, state 11) assigned to the multi-bit ferroelectric device.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for forming a memory device, comprising:
   forming a first ferroelectric material on a first side of a via;
   removing a material to expose a second side of the via; and
   forming a second ferroelectric material on the second side of the via at a different thickness compared to the first side of the via.

2. The method of claim 1, wherein the first ferroelectric material and the second ferroelectric material have different thicknesses.

3. The method of claim 1, further comprising changing a polarization of the first ferroelectric material utilizing a first bias and changing the second ferroelectric material utilizing a second bias.

4. The method of claim 3, wherein the polarization of the second ferroelectric material is not changed when changing the polarization of the first ferroelectric material utilizing the first bias.

5. The method of claim 3, wherein the polarization of the first ferroelectric material is changed when changing the second ferroelectric material utilizing a second bias.

6. The method of claim 1, further comprising assigning a state to a number of polarization combinations between a polarization of the first ferroelectric material and a polarization of the second ferroelectric material.

7. A method for forming a number of ferroelectric memory devices, comprising:
   forming a via;
   forming a first ferroelectric material on an interior side of the via;
   forming a poly material on the first ferroelectric material on the interior side of the via;
   exposing an exterior side of the via;
   forming a second ferroelectric material on the exterior side of the via; and
   removing the poly material to form a number of ferroelectric memory devices.

8. The method of claim 7, wherein forming the first ferroelectric material on the interior side of the via includes forming the first ferroelectric material on the interior side of the via prior to forming the poly material on the first ferroelectric material.

9. The method of claim 8, wherein forming the poly material includes protecting the first ferroelectric material on the interior side of the via while exposing the exterior side of the via.

10. The method of claim 7, wherein forming the first ferroelectric material on the interior side of the via comprises forming the first ferroelectric material at different thickness than the second ferroelectric material formed on the exterior side of the via.

11. The method of claim 7, wherein forming the first ferroelectric material on the interior side of the via includes forming the first ferroelectric material with a different coercive field than the second ferroelectric material formed on the exterior side of the via.

12. A memory device, comprising:
a first ferroelectric material formed on an interior sidewall of a via and having a first thickness; and
a second ferroelectric material formed on an exterior sidewall of the via and having a second thickness.

13. The memory device of claim 12, wherein the first ferroelectric material at the first thickness has a first coercive field and the second ferroelectric material at the second thickness has a second coercive field.

14. The memory device of claim 12, wherein a first bias changes a polarization of the first ferroelectric material on the first side without changing a polarization of the second ferroelectric material on the second side.

15. The memory device of claim 12, wherein a second bias changes a polarization of the first ferroelectric material on the first side and a polarization of the second ferroelectric material on the second side.

16. The memory device of claim 12, wherein a dielectric material separates the first ferroelectric material on the first side and the second ferroelectric material on the second side of the via.

17. A memory device, comprising:
a first ferroelectric material formed on an interior sidewall of a via and having a first thickness; and
a second ferroelectric material formed on an exterior sidewall of the via and having a second thickness; and
wherein the first ferroelectric material and the second ferroelectric material:
are separated by a conductive material; and
have a different coercive field.

18. The memory device of claim 17, wherein the first ferroelectric material is different than the second ferroelectric material.

19. The memory device of claim 17, wherein a polarization of the first ferroelectric material and a polarization of the second ferroelectric material are utilized to provide at least four distinct states of the memory device.

20. The memory device of claim 19, wherein each of the at least four distinct states stores a charge equivalent to a single bit DRAM cell charge.

21. A method of writing data to a multi-bit ferroelectric memory device, comprising:
assigning a state to each of a number of polarization combinations between a first ferroelectric material and a second ferroelectric material; and
wherein:
the first ferroelectric material is formed on an interior sidewall of a via and has a first thickness;
the second ferroelectric material is formed on an exterior sidewall of the via and has a second thickness; and
each of the number of polarization combinations corresponds to a particular applied bias.

22. The method of claim 21, comprising reassigning at least one state for at least one of the number of polarization combinations.

23. The method of claim 21, comprising applying the particular bias to the first ferroelectric material and to the second ferroelectric material to produce at least two polarization directions for the first ferroelectric material and for the second ferroelectric material.

24. The method of claim 21, comprising applying a first bias in a first direction to change a polarization direction of the first ferroelectric material without changing a polarization direction of the second ferroelectric material.

25. The method of claim 21, wherein the number of polarization combinations include a combination of a polarization direction of the first ferroelectric material and a polarization direction of the second ferroelectric material.

26. The method of claim 21, wherein assigning the state to each of the number of polarization combinations includes assigning the state to a number of biases.

27. The method of claim 26, comprising applying a bias to produce a distinct polarization combination between the first ferroelectric material and the second ferroelectric material.

28. The method of claim 21, wherein each state can be independently written by providing the corresponding bias of a particular assigned state.

29. A method of writing data to a multi-bit ferroelectric memory device, comprising:
defining a first state of the multi-bit ferroelectric memory device, wherein the first state includes applying a first bias in a first direction to the multi-bit ferroelectric memory device;
applying a second bias to the multi-bit ferroelectric memory device to generate a second state, wherein applying the second bias includes applying a second voltage in a second direction;
applying a third bias to the multi-bit ferroelectric memory device to generate a third state, wherein applying the third bias includes applying a third voltage that is greater than the second voltage in a second direction; and
applying a fourth bias to the multi-bit ferroelectric memory device to generate a fourth state, wherein applying the fourth bias includes applying a fourth voltage that is less than the third voltage in the second direction;
wherein the multi-bit ferroelectric memory device includes:
a first ferroelectric material formed on an interior sidewall of a via and having a first thickness; and
a second ferroelectric material formed on an exterior sidewall of the via and having a second thickness.

30. The method of claim 29, wherein applying each bias releases a different voltage to a bit line within a memory array.

* * * * *